(12) United States Patent
Kim et al.

(10) Patent No.: US 7,281,321 B2
(45) Date of Patent: Oct. 16, 2007

(54) PRINTED CIRCUIT BOARD HAVING EMBEDDED CAPACITORS USING HYBRID MATERIAL AND METHOD OF MANUFACTURING THE SAME

(75) Inventors: Tae Kyoung Kim, Gyeonggi-do (KR); Jun Rok Oh, Seoul (KR); Jin Cheol Kim, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/361,078

(22) Filed: Feb. 22, 2006

(65) Prior Publication Data

US 2006/0243479 A1 Nov. 2, 2006

(30) Foreign Application Priority Data

Apr. 28, 2005 (KR) .................. 10-2005-0035626

(51) Int. Cl.
*H05K 3/30* (2006.01)
(52) U.S. Cl. .............. 29/832; 29/25.41; 29/25.42; 361/321.2; 361/321.3
(58) Field of Classification Search .......... 29/25.41, 29/25.42, 830, 832; 361/321.2, 321.3
See application file for complete search history.

(56) References Cited

U.S. PATENT DOCUMENTS

| 5,010,641 | A | | 4/1991 | Sisler |
| 5,079,069 | A | | 1/1992 | Howard et al. |
| 5,796,587 | A | * | 8/1998 | Lauffer et al. .............. 361/763 |
| 5,870,274 | A | | 2/1999 | Lucas |
| 6,103,134 | A | | 8/2000 | Dunn et al. |
| 6,256,850 | B1 | * | 7/2001 | Lauffer et al. ............. 29/25.42 |
| 6,349,456 | B1 | | 2/2002 | Dunn et al. |
| 6,370,013 | B1 | * | 4/2002 | Iino et al. ................ 361/306.3 |
| 6,910,266 | B2 | * | 6/2005 | Lee et al. ..................... 29/832 |
| 7,092,237 | B2 | * | 8/2006 | Lee et al. .................... 361/311 |
| 7,100,276 | B2 | * | 9/2006 | Fukuoka et al. .............. 29/830 |
| 7,102,876 | B2 | * | 9/2006 | Lee et al. .................... 361/312 |
| 2002/0145845 | A1 | * | 10/2002 | Hunt et al. ................. 361/303 |
| 2003/0072129 | A1 | * | 4/2003 | Kuwako et al. ............ 361/525 |

FOREIGN PATENT DOCUMENTS

KR     10-2004-0041088     5/2004

* cited by examiner

*Primary Examiner*—Carl J. Arbes
(74) *Attorney, Agent, or Firm*—Darby & Darby P.C.

(57) ABSTRACT

The present invention is related to a printed circuit board having embedded capacitors using a hybrid material and a method of manufacturing the same. This invention provides a printed circuit board having embedded capacitors using a material for a hybrid dielectric layer including liquid crystal polymer and ceramic powder, and a method of manufacturing such a printed circuit board.

11 Claims, 5 Drawing Sheets

PRINTED CIRCUIT BOARD HAVING EMBEDDED CAPACITORS USING HYBRID MATERIAL AND METHOD OF MANUFACTURING THE SAME

INCORPORATION BY REFERENCE

The present application claims priority under 35 U.S.C. §119 to Korean Patent Application No. 10-2005-0035626 filed on Apr. 28, 2005. The content of the application is incorporated herein by reference in its entirety.

BACKGROUND OF THE INVENTION

1. Field of the Invention

The present invention relates, generally, to a printed circuit board (PCB) having embedded capacitors using a hybrid material and a method of manufacturing the same. More particularly, the present invention relates to a PCB having embedded capacitors, in which a hybrid material, comprising liquid crystal polymer and high-frequency ceramic powder dispersed therein, is formed in a sheet shape for use in a capacitor layer, which is then embedded in the PCB, thereby decreasing the variation of capacitance depending on temperature and reducing signal transmission loss by virtue of a low dissipation factor, compared to conventional PCBs having embedded capacitors, and to a method of manufacturing such a PCB.

2. Description of the Related Art

In general, capacitors store energy in the form of an electric field. When a DC voltage source is applied to a capacitor, the capacitor is charged but the current flow stops. On the other hand, if an AC voltage source is connected to a capacitor, the current flows through the capacitor depending on the frequency of the applied AC signal and the value of the capacitor while the capacitor is charged and discharged.

Thus, the capacitor, having the above properties, acts as a passive component essential for use in a variety of purposes, for example, coupling and decoupling, filters, impedance matching, signal matching, charge pumps and demodulation in electric and electronic circuits, such as digital circuits, analog circuits, and high frequency circuits. Further, the capacitors, which are manufactured in various forms, such as chips or disks, have been used in the state of being mounted on PCBs.

The capacitor in the electronic circuit is largely classified into two kinds, depending on the capacitance and temperature stability thereof, that is, a capacitor such as B (A) and F type MLCC (Multi-Layer Ceramic Capacitor), having low temperature stability and high capacitance, and a capacitor such as C type MLCC, having low capacitance and high temperature stability. The former is mainly used for decoupling and bypassing, whereas the latter is used for signal matching and impedance matching.

Although passive components such as capacitors have been manufactured in various forms such as chips or disks to be mounted on PCBs to date, electronic devices have recently been required to be miniaturized and complicated, and thus, the areas for mounting the passive components on the PCB are decreasing. Further, while frequencies increase in accordance with high speed electronic devices, parasitic impedance is generated by the conductors, solders, etc., between the passive components and the IC, thus causing several problems. In order to solve the problems, various attempts have been made to embed the capacitor in the PCB, mainly led by the manufacturers of PCBs and electric and electronic components.

However, since most materials for PCBs having embedded capacitors developed by the manufacturers to date have unstable capacitance depending on the temperature and humidity, they have been limitedly studied only for use in decoupling and bypassing.

In this regard, FIGS. 1A to 1E sequentially illustrate a conventional process of manufacturing a PCB having embedded polymer thick film capacitors. According to the conventional process, a polymer capacitor paste is applied on a substrate and then dried using heat (or cured), to realize the PCB including embedded polymer thick film capacitors, which is specifically described with reference to the drawings.

Figure 1A:
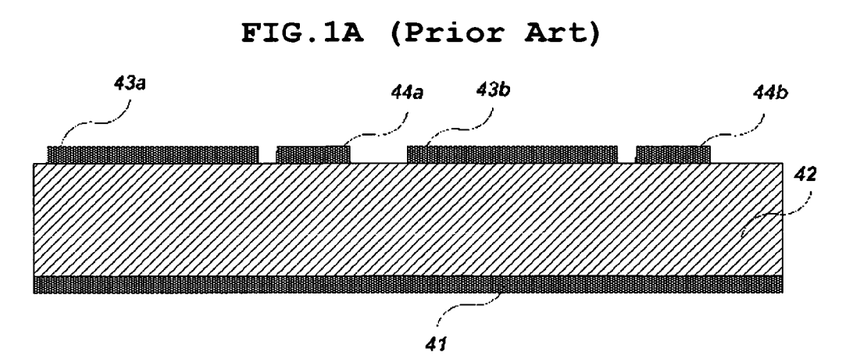
FIGS. 1A to 1E are cross-sectional views sequentially showing a conventional process of manufacturing a PCB having embedded polymer thick film capacitors.

In a first step, a copper foil of an inner layer for a PCB 42 including FR-4 is coated with a dry film, exposed, developed, and then etched, to form anodic copper foils 44a, 44b, cathodic copper foils 43a, 43b, and clearances therebetween (FIG. 1A).

Figure 1B:
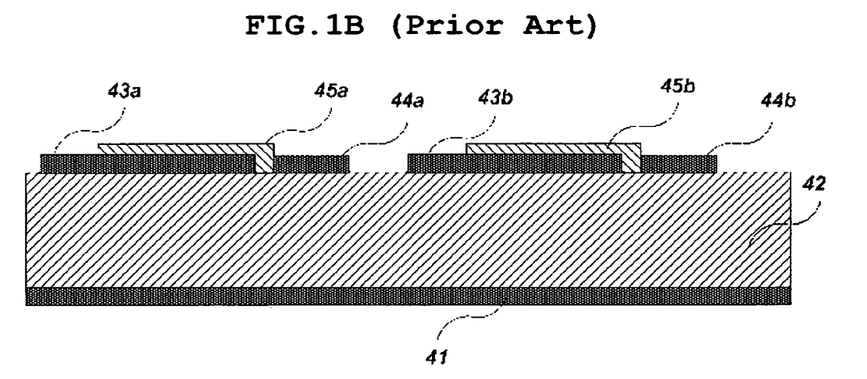

In a second step, capacitor pastes 45a, 45b, composed of a polymer that contains ceramic powder having a high dielectric constant, are applied on the cathodic copper foils 43a, 43b using a screen printing process, and are then dried or cured (FIG. 1B). Herein, the screen printing is performed by passing a medium such as ink through a stencil screen using a squeeze, thereby transferring a pattern to the surface of a substrate.

At this step, the clearances between the anodic copper foils 44a, 44b and the cathodic copper foils 43a, 43b are covered with the capacitor pastes 45a, 45b.

Figure 1C:
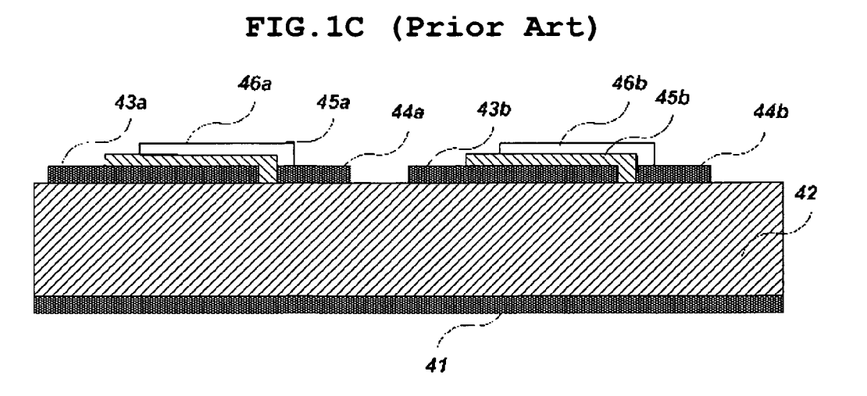

In a third step, a conductive paste including silver or copper is formed into anodes 46a, 46b using a screen printing process, and is then dried or cured (FIG. 1C).

Figure 1D:
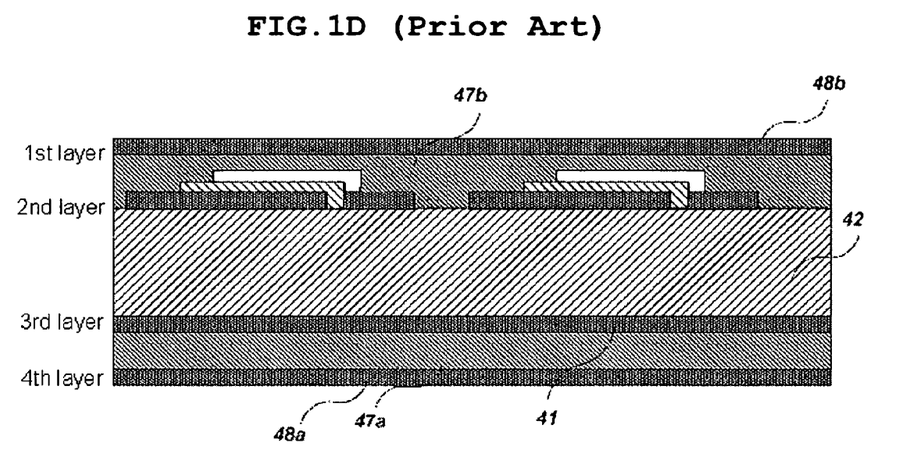

In a fourth step, the capacitor layer, subjected to first to third steps of the inner layer of the PCB 42, is inserted between insulating layers 47a, 47b, followed by being laminated (FIG. 1D).

Figure 1E:
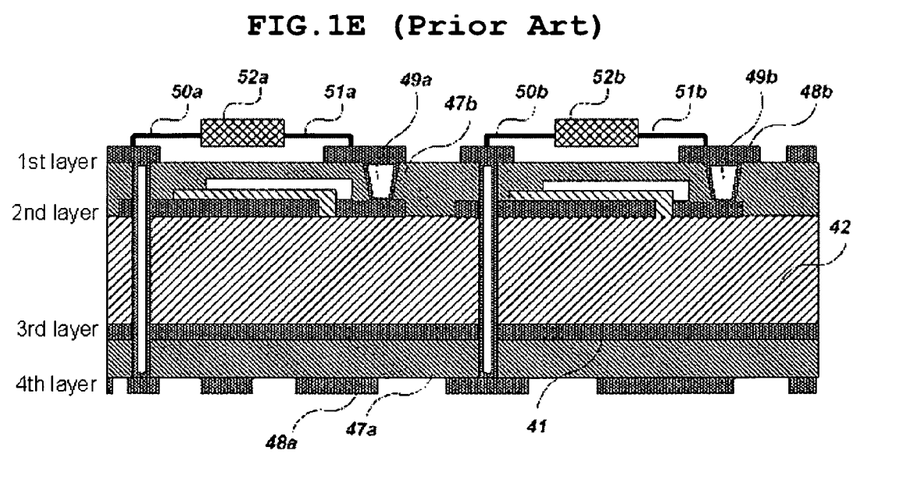

In a fifth step, through holes and laser blind via holes 49a, 49b are formed through the laminate, whereby the capacitor present in the inner layer of the PCB is connected to positive terminals 51a, 51b and negative terminals 50a, 50b of IC chips 52a, 52b mounted outside the PCB, thus acting as an embedded capacitor (FIG. 1E).

Likewise, there are disclosed methods of manufacturing an embedded discrete type capacitor by coating a PCB with a ceramic-filled photo-dielectric resin, which have been patented by Motorola Co. Ltd., USA. The above method comprises applying a photo-dielectric resin containing ceramic powder on a substrate, laminating copper foils on the resin layer to form upper electrodes and lower electrodes, forming a circuit pattern, and then etching the photo-dielectric resin, to realize the discrete capacitor.

Further, there are proposed methods of fabricating an embedded capacitor by separately including a dielectric layer having capacitance properties in the inner layer of a PCB, so as to be used instead of a decoupling capacitor mounted on the PCB, which have been patented by Sanmina Co. Ltd., USA. In this method, the dielectric layer, including power electrodes and ground electrodes, is incorporated in the inner layer of the PCB, to obtain a power-distributed decoupling capacitor.

Various processes are under study to achieve the above techniques, methods of embodying each process being varied.

In this regard, U.S. Pat. No. 5,079,069, granted to Howard et al., discloses a capacitor laminate for use in capacitive PCBs and methods of manufacture, in which the concept of 'borrowed capacitor' is used, to manufacture the PCB including a structurally rigid capacitor thin film layer composed of two conductive layers and a dielectric layer sandwiched between the two layers, which is in operative connection with a large number of devices.

Also, U.S. Pat. No. 5,010,641, granted to Sisler et al., discloses a method of making a multilayer PCB to eliminate the need for the by-pass capacitor by providing one or more fully cured power-ground plane sandwich components which are laminated together with other partially cured component layers of the PCB and circuit pattern-formed components.

According to the conventional techniques, the thick film is formed mainly of epoxy resin and ceramic powder. In the case of the thin film, ceramic, such as barium titanate, is formed into a thin film through a thin film preparation process, which has been invented for embedding a capacitor for use in decoupling and bypassing. Although such a thin film has relatively high capacitance, it entails large variation of capacitance depending on the temperature, and also a high dissipation factor, and is therefore unsuitable for use in embedding the capacitor which has been presently mounted on the PCB for signal matching and impedance matching in high frequency circuits.

SUMMARY OF THE INVENTION

Leading to the present invention, intensive and thorough research into PCBs having embedded capacitors, carried out by the present inventors aiming to avoid the problems encountered in the related art, resulted in the finding that high-frequency ceramic filler may be added to liquid crystal polymer having high dielectric properties at high frequencies to prepare a hybrid material, which is then used as material for a dielectric layer of a PCB having embedded capacitors, thereby manufacturing PCBs having embedded capacitors, in which a temperature compensating MLCC (C type MLCC) presently mounted on the PCB can be embedded in the PCB.

Accordingly, an object of the present invention is to provide a PCB having embedded capacitors using a hybrid material, which can only slightly vary capacitance depending on temperature and humidity and can minimize signal loss and heat emission thanks to a low dissipation factor, compared to conventional PCBs having embedded capacitors.

Another object of the present invention is to provide a method of manufacturing such a PCB.

A further object of the present invention is to provide a PCB having embedded capacitors suitable for use in signal matching and impedance matching in high frequency circuits.

Still another object of the present invention is to provide a method of manufacturing such a PCB.

In order to accomplish the above objects, the present invention provides a PCB having embedded capacitors using a hybrid material, including (A) a double-sided CCL (Copper Clad Laminate), one copper foil of which is formed into a first circuit layer having circuit patterns, the other copper foil of which is formed into a fourth circuit layer having circuit patterns; (B) a hybrid CCL, including a hybrid dielectric layer containing liquid crystal polymer and ceramic powder and copper foils laminated on both surfaces thereof, one copper foil of the hybrid CCL being formed into a second circuit layer having lower electrodes and circuit patterns, the other copper foil thereof being formed into a third circuit layer having upper electrodes and circuit patterns, in which the second circuit layer and third circuit layer are formed such that the lower electrodes of the second circuit layer correspond to the upper electrodes of the third circuit layer; (C) an insulating layer disposed between the CCL of (A) and the hybrid CCL of (B) to be laminated so as to position the first circuit layer of the CCL and the second circuit layer of the hybrid CCL as inner layers facing each other; (D) single-sided CCLs laminated on the third circuit layer and fourth circuit layer; (E) a blind via hole and a through hole formed in predetermined portions of the single-sided CCLs; and (F) a plating layer plated in the blind via hole and through hole.

In the PCB of the present invention, the liquid crystal polymer preferably has a dielectric constant of 3.5 or less and a dissipation factor of 0.0007-0.002.

In the PCB of the present invention, the ceramic powder preferably has a dielectric constant of 5-120 and Q·f of 1,000-150,000.

The ceramic powder is preferably selected from the group consisting of $BaTiO_3$—$TiO_2$, $ZnO$—$MgO$—$SiO_2$, $CaCO_3$—$TiO_2$—$MgO$, $BaO$—$MgO$—$Ta_2O_5$, $ZrO_2$—$SnO_2$—$TiO_2$, $BaO$—$ZnO$—$Ta_2O_5$, $CaCO_3$—$TiO_2$—$Nd_2O_3$—$Li_2CO_3$, $BaTiO_3$—$TiO_2$—$Nd_2O_3$—$Sm_2O_3$—$Bi_2O_3$, and $CaCO_3$—$TiO_2$—$La_2O_3$—$Al_2O_3$.

The ceramic powder preferably has an average particle size of 0.5-2 μm.

The ceramic powder is preferably contained in the dielectric layer in an amount of 5-55 vol %. Further, the dielectric layer is preferably 10-300 μm thick.

In the PCB of the present invention, the layer including the dielectric layer functions as a capacitor for signal matching or impedance matching.

In addition, the present invention provides a method of manufacturing a PCB having embedded capacitors using a hybrid material, including (A) forming either copper foil of a double-sided CCL into a first circuit layer having circuit patterns; (B) laminating copper foils on both surfaces of a hybrid dielectric layer including liquid crystal polymer and ceramic powder dispersed therein and formed in a sheet shape, to form a hybrid CCL; (C) forming either copper foil of the hybrid CCL into a second circuit layer having lower electrodes and circuit patterns; (D) laminating the CCL of (A) and the hybrid CCL of (C) with an insulating layer disposed therebetween such that the first circuit layer of the CCL and the second circuit layer of the hybrid CCL are positioned as inner layers facing each other, thus obtaining a predetermined laminate; (E) forming an outer copper foil provided on the dielectric layer of the laminate of (D) into a third circuit layer having upper electrodes, corresponding to the lower electrodes of the second circuit layer, and circuit patterns; (F) forming the other outer copper foil of the laminate of (D) into a fourth circuit layer having circuit patterns; (G) laminating single-sided CCLs on the third circuit layer and fourth circuit layer; (H) forming a blind via hole and a through hole in predetermined portions of the single-sided CCLs; and (I) plating the blind via hole and through hole to connect the layers.

In the method of the present invention, the step (B) is preferably conducted at 300-350° C. under 400-600 N/cm².

In the method of the present invention, the step (G) is preferably conducted using a building-up process.

DETAILED DESCRIPTION OF THE INVENTION

Hereinafter, a detailed description will be given of the present invention, with reference to the appended drawings.

The present invention provides a PCB having embedded capacitors using a hybrid material, in which a hybrid dielectric layer obtained by adding high-frequency ceramic filler to liquid crystal polymer having excellent high frequency properties is applied, thereby exhibiting a stable dielectric constant and a low dissipation factor suitable for use in signal matching and impedance matching in a high frequency circuit. In addition, a method of manufacturing such a PCB is provided.

In the present invention, the hybrid dielectric layer is formed by incorporating the high-frequency ceramic powder filler into the liquid crystal polymer.

The liquid crystal polymer, which is a thermoplastic resin, has a low dielectric constant and a low dissipation factor, and thus, thorough research into the application of such liquid crystal polymer to insulating materials for PCBs having high frequency circuits has been conducted in recent years. The liquid crystal polymer has a dielectric constant and a dissipation factor of 3.5 or less and 0.003 or less, respectively, at 1 GHz, which are lower than those of other substrate materials. Hence, upon the transmission of high frequency signals, noise and signal loss are decreased, and the moisture absorption factor, which negatively affects the dielectric constant, is also as low as 0.04% or less. As well, the liquid crystal polymer has stable dielectric constant properties (temperature coefficient of capacitance (TCC) ≦hundreds of ppm) relative to the change of temperature.

Although the liquid crystal polymer used in the present invention is not particularly limited, it preferably has a dielectric constant of 3.5 or less and a dissipation factor of 0.0007-0.002 so as to realize device modularization and minimize signal loss.

The high-frequency ceramic powder incorporated as filler into the liquid crystal polymer has a low dissipation factor at a high frequency, and the properties thereof are represented by Q·f and dielectric constant, in which "Q" is an abbreviated form of "Quality Factor", which means a reversed dissipation factor indicating efficiency at high frequencies, and "f" means frequency.

The ceramic powder used in the present invention preferably has a dielectric constant of 5-120 and Q·f of 1000 or more, preferably 1,000-150,000 in order to exhibit desired properties. If Q·f is less than 1,000, signal loss occurs at high frequencies along with the generation of heat.

The ceramic powder is not particularly limited as long as it has properties falling within the above range, but is preferably selected from the group consisting of ZnO—MgO—SiO$_2$, MCT of CaCO$_3$—TiO$_2$—MgO, BaTiO$_3$—TiO$_2$, ZST of ZrO$_2$—SnO$_2$—TiO$_2$, CaCO$_3$—TiO$_2$—La$_2$O$_3$—Al$_2$O$_3$, BaTiO$_3$—TiO$_2$—Nd$_2$O$_3$—Sm$_2$O$_3$—Bi$_2$O$_3$, CaCO$_3$—TiO$_2$—Nd$_2$O$_3$—Li$_2$CO$_3$, and Ba-based perovskite dielectric powders, such as BZT of BaO—ZnO—Ta$_2$O$_5$, and BMT of BaO—MgO—Ta$_2$O$_5$.

Of these ceramic materials, the kind and properties of typically usable high-frequency ceramic material are summarized in Table 1 below.

TABLE 1

High-Frequency Ceramic Powder

| Material | ZnO MgO SiO$_2$ | CaCO$_3$ TiO$_2$ MgO | BaTiO$_3$ TiO$_2$ | ZrO$_2$ SnO$_2$ TiO$_2$ | CaCO$_3$ TiO$_2$ La$_2$O$_3$ Al$_2$O$_3$ | BaTiO$_3$ TiO$_2$ Nd$_2$O$_3$ Sm$_2$O$_3$ Bi$_2$O$_3$ | CaCO$_3$ TiO$_2$ Nd$_2$O$_3$ Li$_2$CO$_3$ |
|---|---|---|---|---|---|---|---|
| Sintered Body Density (g/cm$^3$) | 3.56 | 3.84 | 4.50 | 5.21 | 4.75 | 5.77 | 4.66 |
| Dielectric Constant | 6.43 | 21.09 | 36.65 | 37.36 | 44.88 | 92.03 | 117.32 |
| Q·f$_0$ | 113,745 | 57,024 | 44,436 | 41,808 | 41,164 | 6,712 | 1,132 |

The ceramic powder preferably has an average particle size of 0.5-2 μm. If the average particle size is less than 0.5 μm, the ceramic powder is difficult to disperse. On the other hand, if the average particle size is large than 2 μm, the breakdown voltage is lower for an insulating layer having the same thickness.

The ceramic powder is contained in the dielectric layer in an amount of 5-55 vol % to economically exhibit desired properties.

The hybrid dielectric layer of the present invention may be prepared according to a typical dielectric layer preparation process as mentioned below, but is not limited thereto.

According to the typical dielectric layer preparation process, the ceramic powder is dispersed in the liquid crystal polymer and a solvent to prepare slurry, which is then formed into a thick film having a thickness of 10-300 μm depending on the desired capacitance and available area on a Polyethylene Terephtalate (PET) film coated with a release agent through tape casting as a general sheet forming process. The thick film is dried to volatilize the solvent from the slurry using heat, after which the PET film coated with a release agent is removed, to obtain a hybrid dielectric layer in a sheet shape.

In an embodiment of the present invention, liquid crystal polymer, having a dielectric constant of 2.96 and a dissipation factor of 0.00099 at 1 GHz, is dissolved in a solvent such as PFP (pentafluorophenol), PCP (pentaclorophenol), etc., using a mechanical stirrer, to prepare a solution. Ceramic powder is added to the solution in an appropriate amount, in consideration of the amount of liquid crystal polymer in the solution, and is then dispersed using a basket mill, to prepare slurry.

The ceramic powder may be obtained through calcination and then pulverization as a general ceramic powder preparation process, to have a size of about 1 μm.

The slurry thus prepared is applied on a PET film coated with a release agent using a tape casting process to prepare a thick film, which is then dried to obtain a dielectric layer having a thickness of about 20 μm. The dielectric properties of the hybrid dielectric layer thus obtained are measured. The results are summarized in Table 2 below.

TABLE 2

Dielectric Properties of Hybrid Material

| Ceramic Filler | A<br>$CaCO_3$<br>$TiO_2$<br>MgO | B<br>$BaTiO_3$<br>$TiO_2$ | C<br>$ZrO_2$<br>$SnO_2$<br>$TiO_2$ | D<br>$CaCO_3$<br>$TiO_2$<br>$La_2O_3$<br>$Al_2O_3$ | E | F<br>$BaTiO_3$<br>$TiO_2$<br>$Nd_2O_3$<br>$Sm_2O_3$<br>$Bi_2O_3$ | G |
|---|---|---|---|---|---|---|---|
| Ceramic Powder Amount (vol %) | 30 | 30 | 30 | 30 | 15 | 30 | 45 |
| Dielectric Constant at 1 GHz | 7.1 | 7.8 | 8.6 | 9.4 | 7.3 | 11.2 | 17.2 |
| Loss Value (Df) ($\times 10^{-3}$) at 1 GHz | 1.3 | 1.4 | 1.8 | 2.1 | 2.9 | 2.4 | 2.2 |
| Thickness (μm) | 20 | 20 | 20 | 20 | 20 | 20 | 20 |
| Capacitance Density ($nF/in^2$) | 1.35 | 1.49 | 1.64 | 1.79 | 1.39 | 2.13 | 3.28 |
| TCC (ppm/° C.) | 300 | 370 | 400 | 510 | 480 | 700 | 1,000 |

In cases where a composite material composed of a polymer or a photosensitive resin such as epoxy resin and ceramic is used for a dielectric layer in a conventional PCB having embedded capacitors, the dielectric constant varies greatly with the temperature and the dissipation factor is high. Consequently, it is impossible to embed the capacitor for signal matching, which has been mounted on the PCB, in the PCB.

However, since the dielectric layer formed of the hybrid material of the present invention can exhibit a stable dielectric constant (7-17.2) relative to the change of temperature and a dissipation factor of 0.003 or less as shown in Table 2, it is suitable for use in embedding the capacitor for signal matching, which has until the present been mounted on the PCB.

Referring to FIGS. 2A to 2I, a process of manufacturing a PCB having embedded capacitors using a hybrid dielectric layer, according to the present invention, is illustrated.

FIGS. 2A to 2I are cross-sectional views sequentially showing the process of manufacturing a PCB having embedded capacitors, according to the present invention.

Figure 2A:
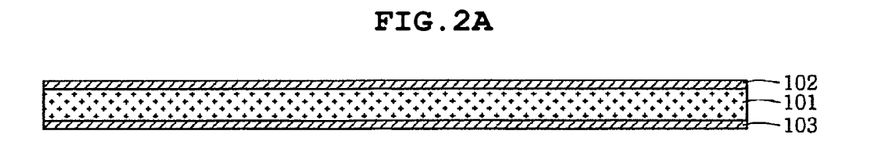
FIGS. 2A to 2I are cross-sectional views sequentially showing a process of manufacturing a PCB having embedded capacitors, according to the present invention.

A double-sided CCL having an insulating resin layer 101 and copper foils 102, 103 provided on both sides thereof is prepared (FIG. 2A).

Figure 2B:
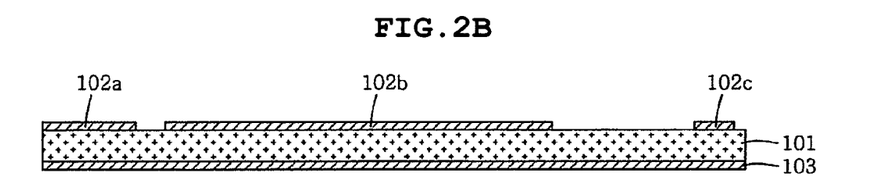

Subsequently, one copper foil 102 of the double-sided CCL is subjected to a typical lithographic process including application of a dry film in a predetermined pattern, removal of the dry film corresponding to etching regions through exposure and development, and then etching the etching regions using an etchant, to form a first circuit layer including circuit patterns 102a, 102b, 102c (FIG. 2B).

Figure 2C:
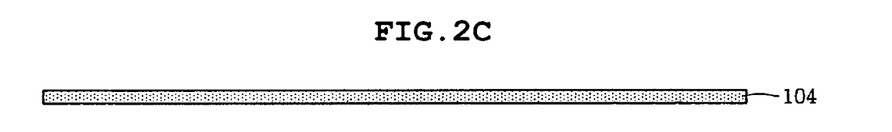

Then, a hybrid dielectric layer 104 in a sheet shape is separately prepared by incorporating ceramic powder, having a dielectric constant of 5-120 and Q·f of 1,000-150,000, into liquid crystal polymer (FIG. 2C). Preferably, the hybrid dielectric layer 104, which is in a sheet shape, may be prepared by mixing liquid crystal polymer, a solvent, and ceramic powder to prepare slurry which is then subjected to tape casting, but this process is not limiting.

As such, the hybrid dielectric layer 104 has a thickness of 10-300 μm to maintain interlayer insulating strength and exhibit necessary capacitance.

Figure 2D:
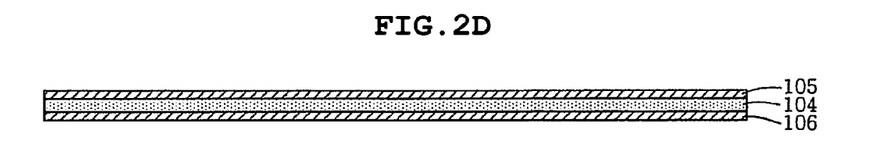

Subsequently, copper foils 105, 106 are laminated on both sides of the hybrid dielectric layer 104 (FIG. 2D). The lamination is preferably conducted at 300-350° C. under 400-600 $N/cm^2$ using a hot vacuum press. If the lamination conditions fall out of the above range, for instance, if the temperature is too low, the liquid crystal polymer as a thermoplastic resin is not sufficiently dissolved and thus adhesion with the copper foil is decreased. On the other hand, if the temperature is too high, the insulating layer flows out of the copper foil due to the overflow of the resin, and thus becomes thin, resulting in a capacitance density that differs from a designed value.

Figure 2E:
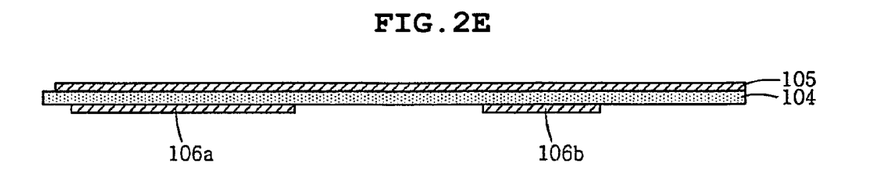

Then, one copper foil 106 of the hybrid CCL is subjected to the lithographic process including the application of a dry film in a predetermined pattern, removal of the dry film corresponding to etching regions through exposure and development, and then etching the etching regions using an etchant, to form a second circuit layer including lower electrodes 106a, 106b and circuit patterns (not shown) (FIG. 2E).

Figure 2F:
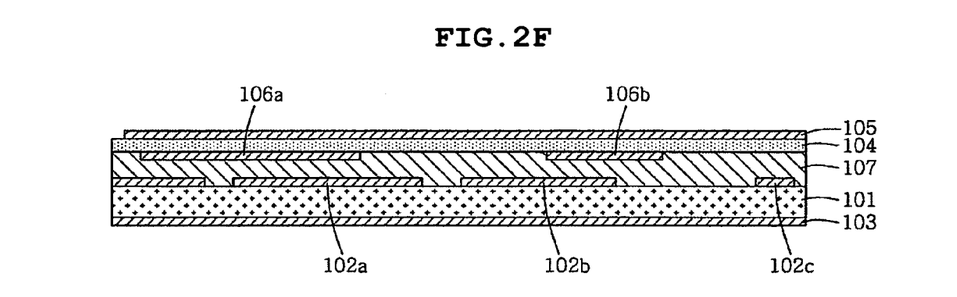

Then, the CCL having the first circuit layer and the hybrid CCL having the second circuit layer are laminated with an insulating layer 107, for example, a prepreg, disposed therebetween by use of a hot vacuum press according to a typical process such that the first circuit layer having circuit patterns 102a, 102b, 102c of the CCL and the second circuit layer having lower electrodes 106a, 106b and circuit patterns (not shown) of the hybrid CCL are positioned as inner layers facing each other (FIG. 2F).

Figure 2G:
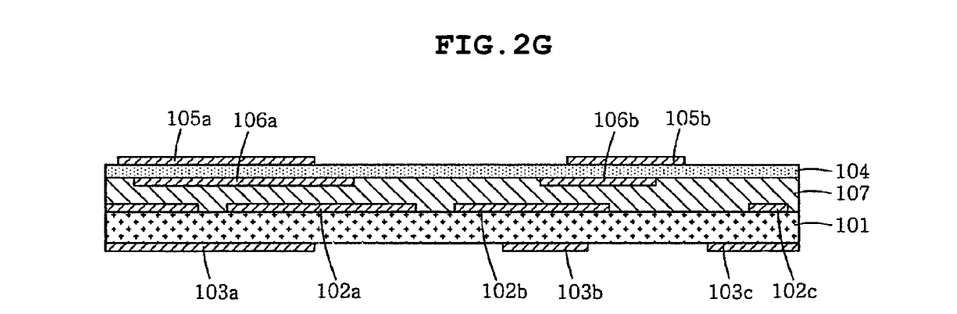

Subsequently, in order to form an outer copper foil 105 provided on the dielectric layer 104 of the laminate thus obtained into upper electrodes 105a, 105b corresponding to the lower electrodes 106a, 106b with the dielectric layer 104 disposed therebetween, the copper foil 105 is subjected to the lithographic process including the application of a dry film in a predetermined pattern, removal of the dry film corresponding to etching regions through exposure and development, and then etching the etching regions using an etchant, to form a third circuit layer including upper electrodes 105a, 105b, corresponding to the lower electrodes 106a, 106b, and circuit patterns (not shown)(FIG. 2G).

Likewise, the other outer copper foil 103 of the laminate is subjected to the lithographic process including the application of a dry film in a predetermined pattern, removal of the dry film corresponding to etching regions through exposure and development, and then etching the etching regions using an etchant, to form a fourth circuit layer including circuit patterns 103a, 103b, 103c (FIG. 2G).

Figure 2H:
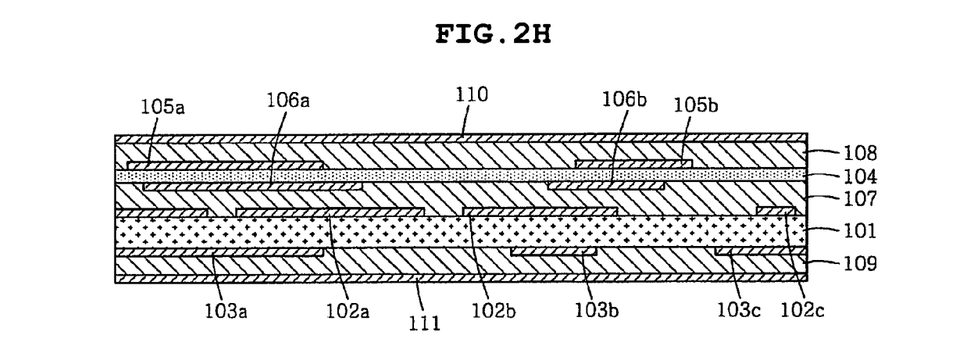

Thereafter, single-sided CCLs 108 and 110, 109 and 111, made of RCC (Resin Coated Copper), are laminated on the third circuit layer, including upper electrodes 105a, 105b and circuit patterns (not shown), and the fourth circuit layer, including circuit patterns 103a, 103b, 103c, respectively, using a building-up process (FIG. 2H).

Figure 2I:
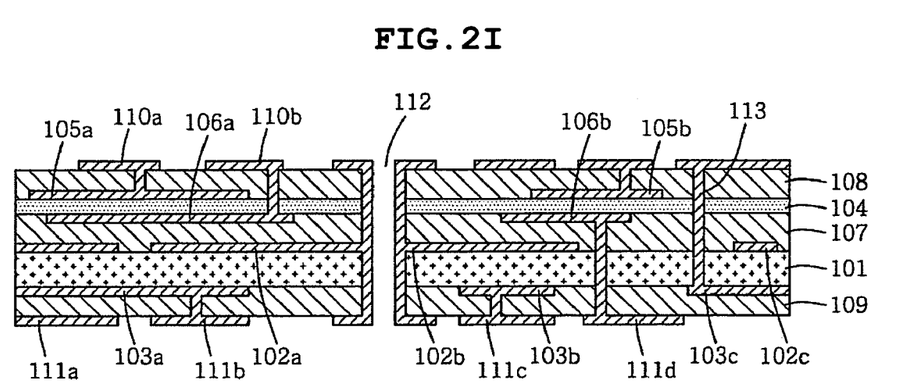

The outer layers 110, 111 of the single-sided CCLs 108 and 110, 109 and 111 are subjected to the above lithographic process to form circuit patterns 110a, 110b, 111a, 111b, 111c, 111d, etc. Then, blind via holes 113 are formed using a laser drill and a through hole 112 is formed using a mechanical drill, and the via holes 113 and the through hole 112 are plated through electroless plating to connect the interlayer circuits (FIG. 2I).

In this way, the capacitor layer formed of a hybrid material obtained by incorporating high-frequency ceramic powder into liquid crystal polymer is embedded in the PCB, thereby realizing an embedded capacitor which is advantageous because the capacitance varies only slightly depending on the temperature and the signal transmission loss is lower thanks to the low dissipation factor, compared to conventional PCBs having embedded capacitors.

Further, a temperature compensating MLCC (C type MLCC), which at present is not embedded in the PCB but is mounted on the PCB, can be embedded in the PCB, thereby providing a PCB having embedded capacitors suitable for use in signal matching and impedance matching in high frequency circuits.

The embodiments of the present invention, regarding the PCB having embedded capacitors using hybrid materials and the method of manufacturing such a PCB, have been disclosed for illustrative purposes, but are not to be construed to limit the present invention, and those skilled in the art will appreciate that various modifications, additions and substitutions are possible, without departing from the spirit of the invention.

As described hereinbefore, the present invention provides a PCB having embedded capacitors using a hybrid material and a method of manufacturing the same. According to the present invention, a hybrid material obtained by adding high-frequency ceramic filler to liquid crystal polymer having high dielectric properties at high frequencies is used for a dielectric layer for a PCB having embedded capacitors, thereby realizing an embedded capacitor layer, which has lower dissipation factor and TCC, resulting in reduced signal loss upon signal transmission, compared to conventional dielectric layers of PCBs having embedded capacitors.

In addition, the kind and amount of high-frequency ceramic filler as well as the area of the electrode may be changed, and thus, the capacitor layer of the present invention can correspond to capacitance and dissipation factor required for various electronic systems.

Hence, even capacitors for signal matching and impedance matching in high frequency circuits, which have been mounted on the PCB due to the large variation of capacitance depending on the temperature and high dissipation factor of the dielectric layer, can be embedded in the PCB.

Many modifications and variations of the present invention are possible in light of the above teachings, without departing from the scope and spirit of the invention as disclosed in the accompanying claims.

What is claimed is:

1. A method of manufacturing a printed circuit board having embedded capacitors using a hybrid material, comprising the steps of:

forming one of an upper and lower copper foil layer of a double-sided copper clad laminate into a first circuit layer having circuit patterns;

laminating copper foils on both an upper and lower surface of a hybrid dielectric layer comprising liquid crystal polymer and ceramic powder dispersed therein and formed in a sheet shape, to form a hybrid copper clad laminate;

forming one of the upper and lower copper foils of the hybrid copper clad laminate into a second circuit layer having lower electrodes and circuit patterns;

laminating the double-sided copper clad laminate and the hybrid copper clad laminate with an insulating layer disposed therebetween such that the first circuit layer and the second circuit layer are positioned as inner layers facing each other, thus forming a predetermined laminate;

forming an outer copper foil layer on the dielectric layer of the laminate of the double-sided copper clad laminate into a third circuit layer having upper electrodes, corresponding to the lower electrodes of the second circuit layer, and circuit patterns;

forming the other outer copper foil layer into a fourth circuit layer having circuit patterns;

laminating single-sided copper clad laminates on the third circuit layer and fourth circuit layer respectively;

forming a blind via hole and a though hole in predetermined portions of the single-sided copper clad laminates; and plating the blind via hole and through hole to connect the layers.

2. The method as set forth in claim 1, wherein the liquid crystal polymer has a dielectric constant of 3.5 or less and a dissipation factor of 0.0007-0.002.

3. The method as set forth in claim 1, wherein the ceramic powder has a dielectric constant of 5-120 and Q·f of 1,000-150,000.

4. The method as set forth in claim 1, wherein the ceramic powder is $BaTiO_3$—$TiO_2$, $ZnO$—$MgO$—$SiO_2$, $CaCO_3$—$TiO_2$—$MgO$, $BaO$—$MgO$—$Ta_2O_5$, $ZrO_2$—$SnO_2$—$TiO_2$, $BaO$—$ZnO$—$Ta_2O_5$, $CaCO_3$—$TiO_2$—$Nd2O_3$—$Li_2CO_3$, $BaTiO_3$—$TiO_2$—$Nd_2O_3$—$Sm_2O_3$—$Bi_2O_3$, or $CaCO_3$—$TiO_2$—$La_2O_3$—$Al_2O_3$.

5. The method as set forth in claim 1, wherein the ceramic powder has an average particle size of 0.5-2 μm.

6. The method as set forth in claim 1, wherein the ceramic powder is contained in the dielectric layer in an amount of 5-55 vol %.

7. The method as set forth in claim 1, wherein the dielectric layer is 10-300 μm thick.

8. The method as set forth in claim 1, wherein the step of laminating copper foils on both the upper and lower surfaces of the hybrid dielectric layer is conducted at 300-350° C. under 400-600 N/cm$^2$.

9. The method as set forth in claim 1, wherein the step of laminating single-sided copper clad laminates is conducted using a building-up process.

10. The method as set forth in claim 1, wherein the hybrid dielectric layer has a dielectric constant of 7-17.2.

11. The method as set forth in claim 1, wherein the hybrid dielectric layer has a capacitance density of 1.35 to 3.28 nF/in$^2$.

* * * * *